United States Patent [19]
Miller

[11] Patent Number: 4,884,119
[45] Date of Patent: Nov. 28, 1989

[54] INTEGRATED MULTIPLE QUANTUM WELL PHOTONIC AND ELECTRONIC DEVICES

[75] Inventor: David A. B. Miller, Fair Haven, N.J.

[73] Assignees: American Telephone & Telegraph Company, New York, N.Y.; AT&T Bell Laboratories, Murray Hill, N.J.

[21] Appl. No.: 184,747

[22] Filed: Apr. 22, 1988

[51] Int. Cl.$^4$ ............................................ H01L 29/12
[52] U.S. Cl. ............................................ 357/58; 357/4; 357/30; 357/16; 357/22; 357/40; 357/41; 357/19
[58] Field of Search ................ 357/4, 19, 30 B, 30 E, 357/30 C, 30 I, 30 P, 30 H, 30 D, 30 G, 58, 16, 22, 40, 41, 22 A, 22 MD

[56] References Cited

U.S. PATENT DOCUMENTS

| | | | |
|---|---|---|---|
| 4,216,485 | 8/1980 | Page | 357/19 |
| 4,327,962 | 5/1982 | Reisman | 357/19 X R |
| 4,384,447 | 3/1984 | Copeland, III et al. | 359/19 |
| 4,546,244 | 10/1985 | Miller | 357/58 X |
| 4,692,207 | 9/1987 | Bouadma et al. | 156/649 |
| 4,701,774 | 10/1987 | McIlroy et al. | 357/58 X R |

FOREIGN PATENT DOCUMENTS

| | | | |
|---|---|---|---|
| 0033137 | 8/1981 | European Pat. Off. | |
| 58-161366 | 9/1983 | Japan | 357/30 E |
| 60-182779 | 9/1985 | Japan | 357/19 |

OTHER PUBLICATIONS

Chen et al., "Vertical Integration of an InGaAsP/InP Heterojunction Bipolar Transistor and a Double Heterostructure Laser," *Appl. Phys. Lett*, 50 (14), Apr. 6, 1987, pp. 874–876.

Abeles et al., "Integration of GaAs MESFET Drivers with GaAs Directional-Coupler Electro-Optic Modulators," *Electronics Letters*, Sep. 24, 1987, vol. 23, No. 20, 1037–1038.

Choi et al., "Monolithic Integration of GaAs/AlGaAs Double-Heterostructure Led's and Si MOSFET's," *IEEE Electron Device Letters*, vol. EDL-7, No. 9, Sep. 1986, pp. 500–502, (cont'd from previous page).

Wake et al., "Monolithically Integrated InGaAs/InP PIN-JFET Photoreceiver," *Electronics Letters*, Jun. 19, 1986, vol. 22, No. 13, pp. 719–720.

Yamaroshi et al., "AlGaAs/GaAs Multi Quantum-Well (MQW) Laser Applied to Monolithic Integration with FET Driver," *Electronics Letters, Nov. 24, 1983*, No. 24, vol. 19, 1020–1021.

Zipperian t al., "A GaAs/In$_{25}$Ga$_{75}$As/GaAs Modulation-bo Peb, Single, Strained Quantum-Well FET," *Inst. Phys, Conf. Ser*, No. 79; Chap. 78, Int. Symp. GaAs and Related Compounds, Karuiza, Japan, 1985, pp. 421–425, (cont'd from previous page).

Esakiet et al., "Ion Beam Growth Method," *IBM Technical Disclosure Bulletin*, vol. 12, No. 12, May 1970, p. 2134.

*Electronics Letters*, vol. 23, No. 20, Sep. 1987, "Integration of GaAs MESFIT Drivers with GaAs Directional-Coupler Electro-Optic Modulators" by J. H. Abeles et al., pp. 1037–1038.

*IEEE Electron Device Letters*, vol. EDL-7, No. 9, Sep. 1986, "Monolithic Integration of GaAs/AlGaAs Double-Heterostructure LED's and Si MOSFET's", by H. K. Choi et al., pp. 500–502.

(List continued on next page.)

*Primary Examiner*—William A. Mintel
*Attorney, Agent, or Firm*—Gregory C. Ranieri

[57] ABSTRACT

In an optoelectronic integrated circuit, an electronic device is integrated with an optical device by fabricating the electronic device directly in a doped semiconductor layer of the optical device. The optical devices contemplated for use include at least a region of multiple low-doped or intrinsic quantum well layers; electronic devices include bipolar and field-effect transistors. Resulting integrated circuits exhibit a high degree of planarity.

8 Claims, 5 Drawing Sheets

OTHER PUBLICATIONS

*Electronics Letters,* vol. 19, Nov. 1983, "AlGaAs/GaAs Multiquantum–Well (MQW) Laser Applied to Monolithic Integration with FET Driver", by S. Yamakoshi et al., pp. 1020–1021.

*Electronics Letters,* vol. 23, No. 23, Nov. 5, 1987, "Dynamic Response of an Integratd Optoelectronic Logic Device", by P. Wheatley et al., pp. 1249–1250.

*Appl. Phys. Lett.,* 50 (14), Apr. 6, 1987, "Vertical Integration of an InGaAsP/InP Heterojunction Bipolar Transistor and a Double Heterostructure Laser", by T. R. Chen et al., pp. 874–876.

*Proceedings of the IEEE International Semiconductor Lasers Conference,* Kanazawa, Japan, Oct. 1986, "Monolithic Integration of DFB Lasers and MQW Optical Modulators", by Y. Kawamura et al.

INTEGRATED MULTIPLE QUANTUM WELL PHOTONIC AND ELECTRONIC DEVICES

TECHNICAL FIELD

This invention relates to integrated semiconductor devices and, more particularly, to monolithic integration of electronic and optical or photonic devices.

BACKGROUND OF THE INVENTION

Device fabrication techniques are sufficiently advanced to permit integration of electronic and optical devices on a single chip. These optoelectronic integrated circuits, referred to as OEICs, have been realized generally with light sources and a small transistor driving using a AlGaAs/GaAs semiconductor system. See H. Choi et al., *IEEE Electron Device Letters,* Vol. EDL-7, No. 9, pp. 500-2 (1986). More recently, these techniques have been extended to realization of a multiple quantum well (MQW) laser with a field-effect transistor (FET) driver circuit. See S. Yamakoshi, et al., *Electronics Letters,* Vol. 19, No. 24, pp. 1020-1 (1983).

In general, it is accepted that difficulty exists in integration of optical and electronic devices because of significant differences in layer structures for the optical element and for the electronic element. Yamakoshi et al., cited above, address and design around this problem by creating two distinct levels in the top surface of a semi-insulating substrate: the lower level for accepting growth of the MQW heterostructure laser, and the upper level for accepting growth of the FET driver. A relatively wide groove etched in the semi-insulating substrate is so configured that it permits selective growth of the laser "substrate" layer along the exposed surface of the lower level (the bottom of the groove) as well as continuing up and onto a portion of the upper level. Hence, Yamakoshi et al. have made it possible to grow and interconnect two separate elements as an optoelectronic integrated circuit albeit a substantially hybrid interconnection. As such, the resulting optoelectronic integrated circuit is fabricated in a nonplanar fashion by interconnecting discrete devices grown separately and electrically isolated from one another on the semi-insulating substrate. Primarily of the device is seriously compromised by the two level technique realized by groove formation as required by Yamakoshi et al. for permitting growth of the MQW heterostructure laser.

Alternative fabrication techniques which avoid the necessity for bi-level circuit designs generally involve the use of vertical regions interposed or eliminated between the optical and electronic devices for electrical isolation. See, for example, D. Wake et al., *Electronics Letters,* Vol. 22, No. 13 pp. 719-21 (1986); J. H. Abeles et al., *Electronics Letters,* Vol. 23, No. 20, pp. 1037-8 (1987); and U.S. Pat. No. 4,438,447. These techniques require additional processing to form the vertical isolation regions and subsequently establish the appropriate electrical connection between the devices.

SUMMARY OF THE INVENTION

Planarity is preserved and full integration is achieved in an optoelectronic integrated circuit wherein electronic devices such as bipolar or field-effect transistors are fabricated in a doped layer of a semiconductor MQW device such as a p-i-n diode. That is, the optical and electronic devices share a common operational layer which in turn permits ease in processing without the earlier problems of additional fabrication steps for device interconnection.

In one embodiment, a wafer is grown having the following sequentially grown layers: an n-type layer, an alternating stack of thin semiconductor layers forming an intrinsic MQW region, and a p-type layer. Photolithographic patterning followed by diffusion of proper dopants into the n-type layer of the MQW structure, for example, permits formation of electronic devices and circuits in the common n-type layer. As such, the resulting device can operate to electronically control an optical signal, to optically control an electrical signal, or some combination of both.

BRIEF DESCRIPTION OF THE DRAWING

A more complete understanding of the invnvention may be obtained by reading the following description of specific illustrative embodiments of the invention in conjunction with the appended drawings in which.

DETAILED DESCRIPTION

Optoelectronic integrated circuits are generally realized using different and somewhat incompatible processing technologies by making discrete, electrically isolated optical and electronic devices on a common substrate. The resulting circuits are usually nonplanar.

The present invention permits highly planar circuits to be fabricated using efficient and convenient means for converting between the two device technologies. Complex processing is avoided by judicious use of an existing layer of the optical or photonic device for fabrication of the electronic device. Hereinafter, the term "optical" will be understood to refer to both optical and photonic devices. Also, vertical regions interposed between the electronic and optical devices are rendered unnecessary because of the existence an intrinsic region employed by the optical device and underlying the electronic device.

Figure 1:
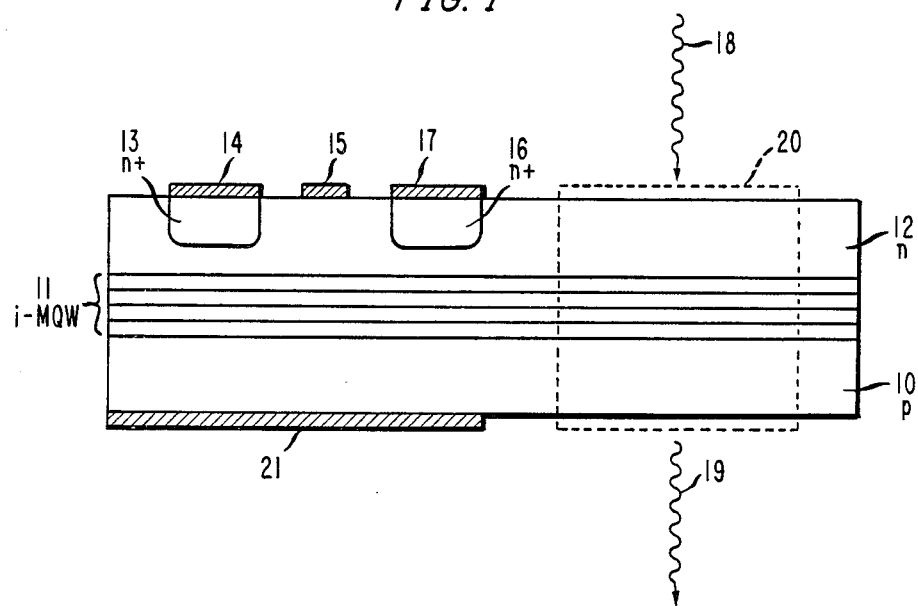
FIG. 1 shows a cross-sectional view of an optoelectronic integrated circuit in accordance with the principles of the present invention.

A cross-sectional view of an exemplary optoelectronic circuit in accordance with the principles of the invention is shown in FIG. 1. The optoelectronic circuit includes an optical device generally in dashed region 20 and an electronic device such as the metal-semiconductor field effect transistor (MESFET) depicted in FIG. 1 shown adjacent to the optical device. For a more complete understanding, it may be beneficial to refer to FIG. 2 which presents a different illustration of the embodiment shown in FIG. 1.

It should be noted that semiconductor layer thicknesses shown in FIG. 1 and other similar Figs. have not been drawn to scale and are merely illustrative to assist in the understanding of the present invention. While specific semiconductor compounds and dopants are described below with respect to the embodiments shown in the Figs., it is understood by those persons skilled in the art that other semiconductor compounds such as those from Group III-V systems and their respective dopants may be employed to practice the invention without departing from its spirit and scope.

With respect to propagation directions for various light beams shown in the FIGS., it should be clear to persons skilled in the art that, for propagation directions substantially normal to the top or bottom surfaces of the quantum well region, it is expected that the propagating light beam may impinge in either one or the opposite normal direction. Also, in order to slightly reduce the potential need to drive the circuits, it is possible to have the light beams propagating in any of the directions parallel to the top and bottom surfaces of the quantum well region.

The monolithically integrated circuit shown in FIG. 1 is fabricated as follows using standard epitaxial growth techniques such as molecular beam epitaxy or vapor phase epitaxy or the like. Sinc the Group III-V semiconductor system used in this example is GaAs/AlGaAs, beryllium is utilized as a p-dopant and silicon is an n-dopant. Also, the aluminum mole fraction is maintained for this example substantially a 0.29. A semi-insulating GaAs substrate (not shown) is used for commencing the epitaxial growth process. First, doped semiconductor layer 10 is grown including a 1500 Angstrom thick, p-type ($\sim 10^{18}$ cm$^{-3}$) GaAs buffer sublayer followed by a 1 $\mu$m thick, p-type ($\sim 10^{18}$ cm$^{-3}$) AlGaAs sublayer. Intrinsic region 11 is grown over doped semiconductor layer 10. The intrinsic region includes a plurality of pairs of layers grown without intentional doping to form a plurality of pairs of quantum well regions. For example, sixty seven (67) pairs of layers are grown and each pair comprises a 95 Angstrom thick GaAs layer followed by a 55 Angstrom thick AlGaAs layer. Doped semiconductor layer 12 is then grown comprising a 3300 Angstrom thick, n-type ($\sim 10^{17}$ cm$^{-3}$) GaAs sublayer followed by a 500 Angstrom thick, n+ type ($\sim 2 \times 10^{18}$ cm$^{-3}$) GaAs sublayer. An alternative to the final n+ GaAs sublayer is the formation of diffused or implanted n+ type sections 13 and 16 in layer 12. Standard photolithographic mask and etch processes as well as standard ion implantation and/or diffusion techniques may be employed to form n+ type sections 13 and 16.

At this point, wafer growth is completed and device fabrication proceeds as follows. Source contact 14 and drain contact 17 are formed by standard masking and metallization processes over heavily doped sections 13 and 16, respectively. Contacts 14 and 17 are generally ohmic in nature employing suitable metals or alloyed metals such as Au-Ge to provide good adhesion and low contact resistance. In the example described herein, a 6 $\mu$m spacing was used between the source and drain. At this stage in the the processing, it is necessary to isolate the optoelectronic integrated circuits, one from the other, by a standard masking and mesa etch step. The mesa etch is carried through doped semiconductor layer 12 around the perimeter of each optoelectronic circuit leaving a mesa as shown illustratively in FIG. 2. The mesa etching effectively isolates the field transistors from one another provided the transistors to be isolated are not forward biased with respect to the common doped layer 10. A gate mask is formed to permit formation of a metallic gate contact 15 (rectifying contact such as MOS or Schottky) centered between the source and drain. Nominally, the gate mask exposes a 2 $\mu$m wide strip in which a chemical etchant is applied to remove n-doped GaAs sublayer material to a depth of approximately 1000 Angstroms for adjusting the transistor threshold. After gate metallization for forming gate 15, the gate mask is removed. Wires are attached to source, gate and drain pads (see FIG. 2) and the whole circuit is epoxied to a transparent substrate such as sapphire or glass with the processed side attached to the transparent substrate. The GaAs semi-insulating substrate and buffer sublayer are removed under devices of interest because the GaAs semi-insulating substrate is generally opaque for various desirable operating wavelengths. Finally, a lower contact 21 may be formed on the exposed side of doped semiconductor layer 10 at least under the electronic device. Electrical contact to layer 10 may alternatively be made through another forward biased n-i-p diode elsewhere in the structure.

While it has not yet been explicitly described, it should be noted that a p-i-n quantum well optical modulator has been formed as optical device 20 adjacent to the MESFET.

In operation, a bias voltage $V_B$ is supplied to contact 21 while source voltage $V_S$ and drain voltage $V_D$ are supplied to source contact 14 and drain contact 17, respectively. The bias voltage $V_B$ is chosen to be more negative than the source and drain voltages. It is expected that the source and drain voltages may change in response to gate voltage changes or other changes in an external circuit to which the transistor is connected.

The reverse biased n-i-p diode in device 20 functions electrically as a reverse bias isolation inhibiting current flow between the source and drain in the absence of photoexcitation. While basic transistor operation is generally unaffected by the n-i-p device, it is important to include the existence of a reverse isolation depletion region ion calculations for pinch-off effects.

For optical operation, an electric field imposed in the quantum well region varies in response to variations in transistor operation. As a consequence, the field effect transistor can controllably vary optical absorption (or alternatively index of refraction as per Kramers-Kronig relationship) of the quantum well material. It should thus be understood that the type of circuit shown in FIG. 1 is adapted for direct modulation of light input signal 18 to produce modulated light output signal 19 or where a probe optical input signal is modulated in response to the state of the field effect transistor to output an optical signal corresponding to the transistor state. In these examples, it is assumed that the wavelength of optical signal 18 is near the optical bandedge for the quantum well region.

While the description above is based on transparent or partially transparent doped semiconductor layers for the optical device to operate in the transmissive mode, it is expected that the same device will operate in a reflective mode by adding a reflective surface or coating to the exposed bottom surface of layer 10 or using an internal mirror as described in G. Boyd et al., *Appl. Phys. Lett.* Vol. 50, pp. 1119 et seq. (1987).

Figure 3:
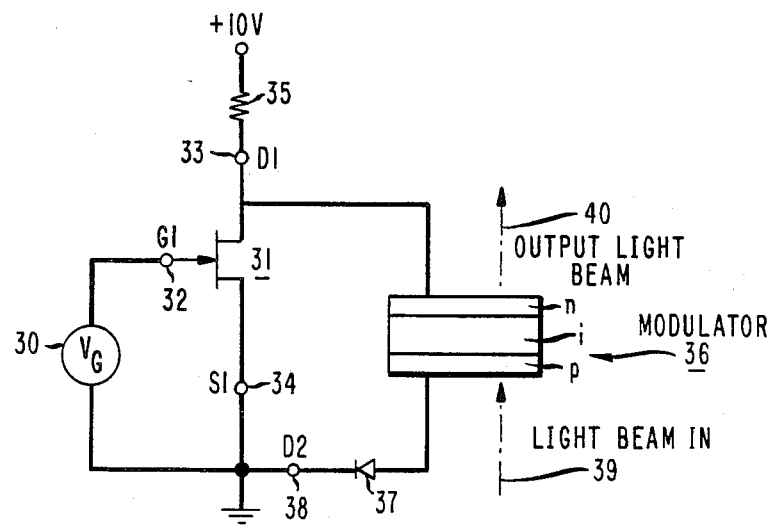
FIG. 3 shows an electrical schematic view of the embodiment of the optoelectronic integrated circuit from FIGS. 1 and 2.
Figure 2:
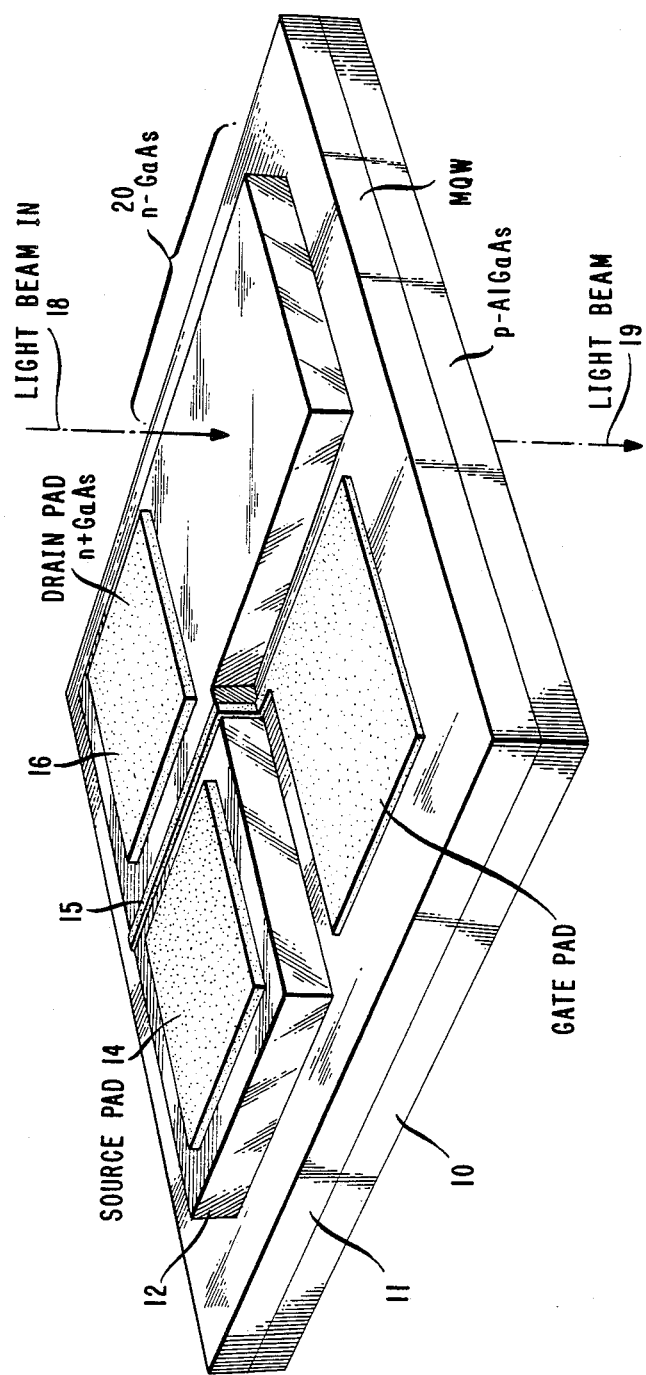
FIG. 2 shows a perspective view of one embodiment for the optoelectronic integrated circuit from FIG. 1.

A circuit substantially similar to those shown in FIGS. 1 and 2 is shown in FIG. 3. As shown, a diode 37, a field effect transistor 31 and a quantum well modulator 36 are integrated into the monolithic optoelectronic circuit whereas the resistor 35 and voltage source ($V_G$) 30 are external components. In this exemplary embodiment, two adjacent field effect transistors fabricated on the same substrate are included to form this circuit.

To implement the optoelectronic circuit shown in FIG. 3, a first field effect transistor 31 having source S1 at contact 34, gate G1 at contact 32, and drain D1 at contact 33 are connected in the conventional transistor configuration with the integrated modulator 36. That is, drain D1 is connected to the n-doped semiconductor layer of the modulator 36; gate G1 is connected to gate voltage source 30 which supplies a voltage signal $V_G$; and source S1 is connected to ground. Drain D1 is attached through an external current limiting resistor 35 (10kΩ) to a nominal bias supply voltage (+10 volts). The contacts of the second field effect transistor are unconnected except for drain D2 at contact 38. This connection is made to source S1 at ground and to the opposite side of source 30 from gate G1 that the effective diode 37 formed thereby from the second field effect transistor through the n-i-p layers under drain D2 is forward biased. The p-layer under drain D2 is common to modulator 36 so that the element interconnection is already formed.

Figure 4:
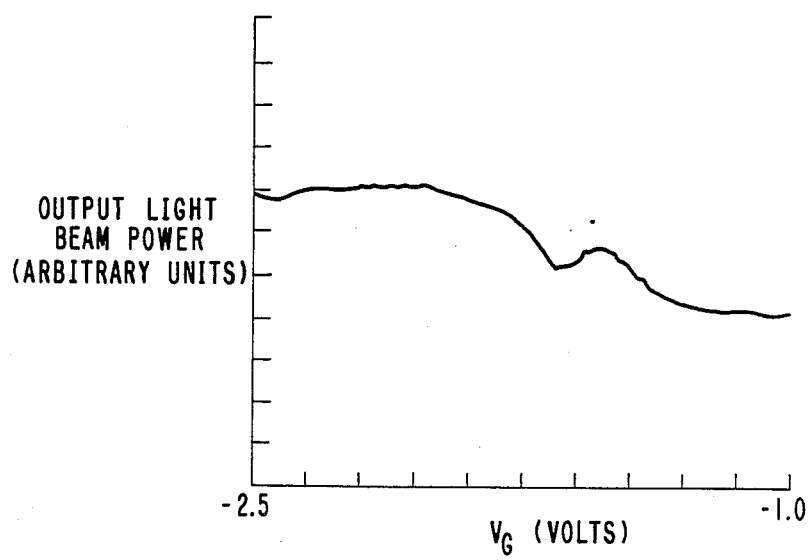
FIG. 4 shows a graph of output light power versus gate control voltage for the device shown in FIG. 1.

Input light beam 39 is directed onto modulator 36 and is modulated by variations in the gate voltage $V_G$ from source 30. A modulated output light beam 40 emerges from modulator 36. For GaAs devices described previously, a suitable operating wavelength is approximately 853.9 μm. Results from operation of the circuit in FIG. 3 are shown in FIG. 4. The results are indicative of the control of output light beam power by gate voltage variation.

Figure 6:
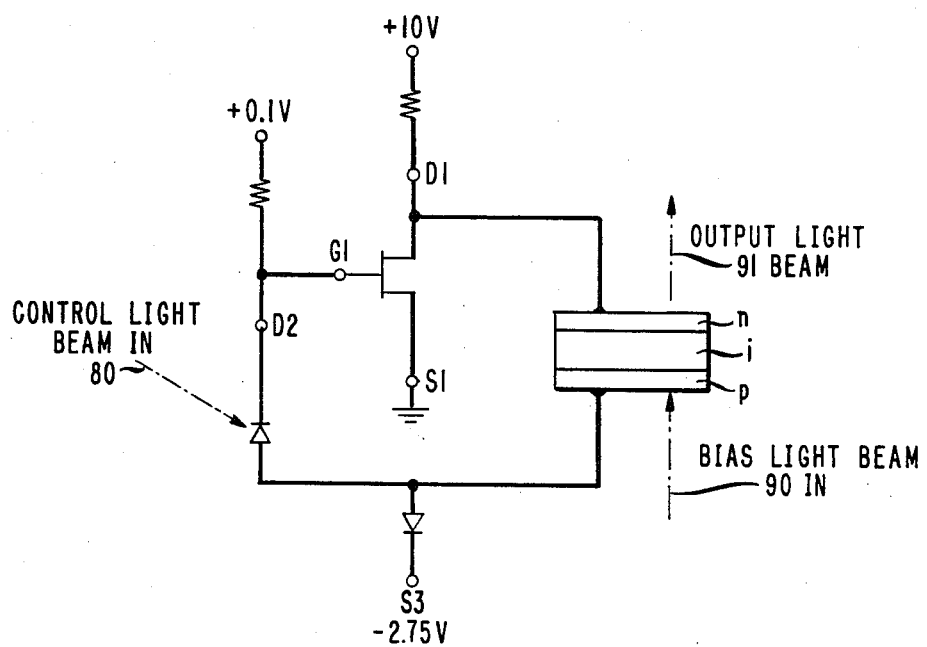
FIG. 6 shows an electrical schematic view of the embodiment for the optoelectronic integrated circuit from FIG. 5.
Figure 5:
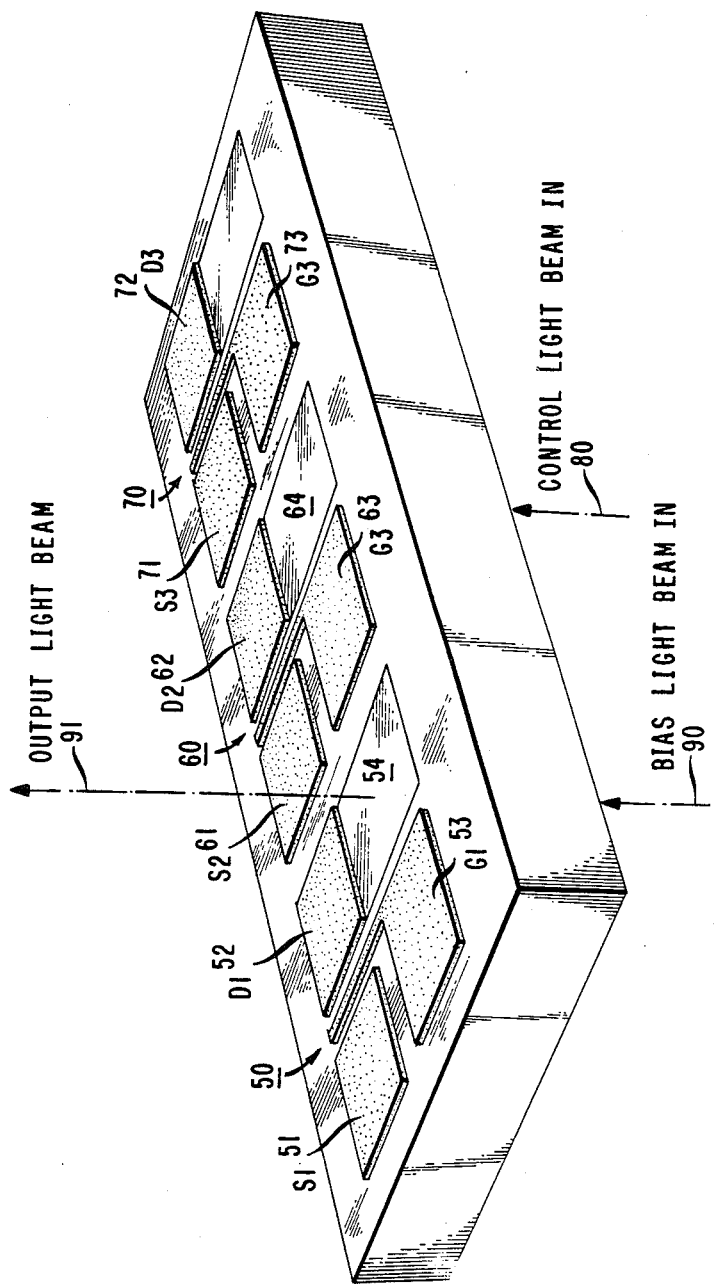
FIG. 5 shows a perspective view of one embodiment for an optoelectronic integrated circuit of higher complexity developed in accordance with the principles of the present invention.

An optoelectronic integrated circuit in accordance with the principles of the invention which incorporates an optical control beam as well as another set of optical inputs is shown in illustrative wafer form in FIG. 5 and schematically in FIG. 6. This circuit includes a first mesa 50, a second mesa 60 and a third mesa 70, all on the same substrate. First mesa 50 includes a n-i-p quantum well modulator 54 and a field effect transistor having source S1 at contact 51, drain D1 at contact 52 and gate G1 at contact 53; second mesa 60 includes an n-i-p quantum well modulator 64 and a field effect transistor having source S2 at contact 61, drain D2 at contact 62 and gate G2 at contact 63; and third mesa 70 includes an n-i-p quantum well modulator 74 and a field effect transistor having source S3 at contact 71, drain D3 at contact 72 and gate G3 at contact 73. The details of the individual semiconductor layers are supplied in reference to FIG. 1.

The field effect transistor in mesa 50 is used in a conventional configuration of a field effect transistor and an integrated quantum well modulator. Source S1 is attached to ground and drain D1 is attached to a supplied bias potential of 10.0 V through a 10kΩ limiting resistor. Under drain D2 in mesa 60, there is an n-i-p structure which is employed as a photodiode responsive to control light beam 80. Drain D2 is connected to gate G1 and to a dc bias voltage of approximately 0.1 V through a 1MΩ resistor; no other external connections are made to the devices in mesa 60. Under the source S3 in mesa 70, there is an n-i-p diode structure which serves as a forward biased connection to the common p-doped semiconductor layer underlying the devices. Source S3 is connected to a supplied bias potential of −2.75 V.

In operation, control light beam 80 is incident upon drain D2 to generate a photocurrent in the n-i-p diode and, thereby, change the potential across the 1MΩ limiting resistor. In turn, the voltage applied to gate G1 is caused to change with a resulting change in the voltage on drain D1, and thereby, a change across the quantum well modulator 54 in mesa 50. A constant bias light beam 90 incident on modulator 54 is modulated in response to voltages changes at drain D1 to cause modulator light beam 91 to appear from modulator 54. Modulated output light beam 91 is controlled in power as a function of the power of control light beam 80 as depicted by the graphical plot shown in FIG. 7.

Figure 7:
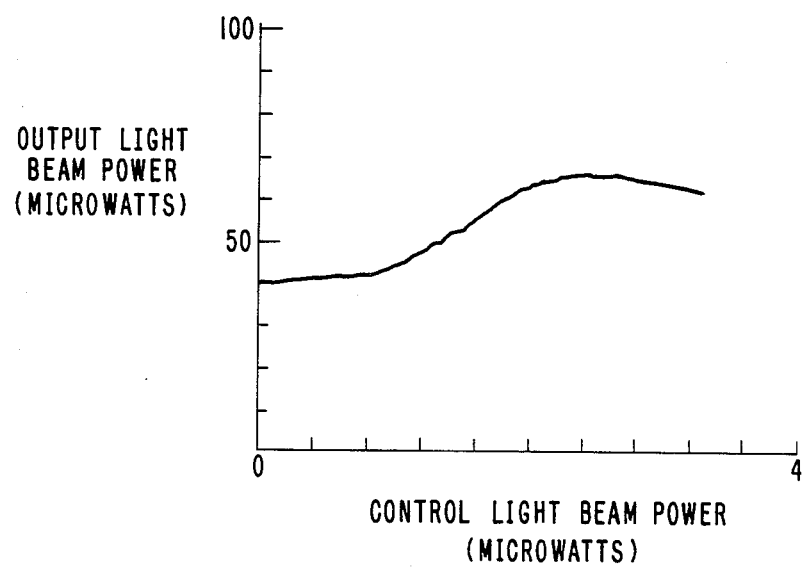
FIG. 7 shows a graph of output light power versus control light power for the device shown in FIG. 6.

From FIG. 7, it is clear that the control light beam influences the output light beam and small control light beam power can affect large power changes in the output light beam to provide signal gain. The results shown in FIG. 7 were achieved with a 450 μW bias light beam at a wavelength of 856.1 nm.

It should be clear to those persons skilled in the art that the conductivity types of the layers may be reversed and the material systems for the semiconductor layers may be changed without departing from the spirit and scope of the present invention.

For persons skilled in the art, it may now be clear that this invention is useful for integrating optical modulators and/or detectors with electronic devices such as bipolar transistors, MOSFETS and MESFETS wherein a substantially planar fabrication process is employed.

What is claimed is:

1. An optoelectronic integrated circuit comprising an optical device and an electronic device said optical device including a first doped semiconductor layer, a second doped semiconductor layer, a conductivity type for said first doped semiconductor layer being opposite to the conductivity type for said second doped semiconductor layer, and an intrinsic region interposed between said first and second doped semiconductor layers, and said electronic device including at least first and second doped semiconductor regions confined to said first doped semiconductor layer, said electronic device adjacent to said optical device and said first doped semiconductor layer being electrically continuous over a region substantially including both said electronic device and said optical device.

2. The optoelectronic integrated circuit as defined in claim 1 wherein said intrinsic region includes at least one quantum well region.

3. The optoelectronic integrated circuit as defined in claim 2 wherein said electronic device includes first, second and third regions confined to said first doped semiconductor layer, and means for applying an electrical signal to each of said first, second and third regions.

4. The optoelectronic integrated device defined in claim 2 wherein said first and second doped semiconductor layers and said intrinsic region consist of compositions selected from Group III-V compounds.

5. An optoelectronic integrated circuit comprising an optical device and an electronic device, said optical device including a first doped semiconductor layer, a second doped semiconductor layer, a conductivity type for said first doped semiconductor layer being opposite to the conductivity type for said second doped semiconductor layer, and an intrinsic region interposed between said first and second doped semiconductor layers, said electronic device including at least first and second doped semiconductor regions confined to said first doped semiconductor layer, said electronic device adjacent to said optical device, said first doped semiconductor layer being electrically continuous over a region substantially including both said electronic device and said optical device, and said electronic device for controlling operation of said optical device.

6. The optoelectronic integrated circuit as defined in claim 5 wherein said intrinsic region includes at least one quantum well region.

7. The optoelectronic integrated circuit as defined in claim 6 wherein said electronic device includes first, second and third regions confined to said first doped semiconductor layer, and means for applying an electrical signal to each of said first, second and third regions.

8. The optoelectronic integrated circuit defined in claim 6 wherein said first and second doped semiconductor layers and said intrinsic region consist of compositions selected from Group III-V compounds.

* * * * *